(12) United States Patent
Lei et al.

(10) Patent No.: US 9,570,562 B1
(45) Date of Patent: Feb. 14, 2017

(54) METHOD OF PLANARIZING POLYSILICON GATE

(71) Applicants: Tong Lei, Shanghai (CN); Junhua Yan, Shanghai (CN)

(72) Inventors: Tong Lei, Shanghai (CN); Junhua Yan, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/235,172

(22) Filed: Aug. 12, 2016

(30) Foreign Application Priority Data

May 17, 2016 (CN) .......................... 2016 1 0327876

(51) Int. Cl.
*H01L 21/28* (2006.01)
*H01L 29/40* (2006.01)
*H01L 29/49* (2006.01)

(52) U.S. Cl.
CPC ....... *H01L 29/401* (2013.01); *H01L 21/28035* (2013.01); *H01L 29/4916* (2013.01)

(58) Field of Classification Search
CPC ............. H01L 29/401; H01L 21/28035; H01L 29/4916
See application file for complete search history.

(56) References Cited

U.S. PATENT DOCUMENTS

2015/0171103 A1\* 6/2015 Ishida ............... H01L 27/11573
438/424

\* cited by examiner

*Primary Examiner* — Selim Ahmed

(57) ABSTRACT

A method of planarizing a polysilicon gate are provided, comprising: growing a polysilicon gate layer on a substrate with trenches; depositing an oxide layer on the polysilicon gate layer; oxidizing the top portion of the polysilicon gate layer from the flat surface of the oxide layer, so as to form a silicon oxide interlayer in the top portion of the polysilicon gate layer; the bottom of the silicon oxide interlayer is aligned with or lower than the low-lying areas of surface of the polysilicon gate layer; removing the oxide layer and the silicon oxide interlayer, so as to obtain a flat surface of the polysilicon gate layer and avoid a series of problems resulted from the uneven surface in the subsequent processes.

12 Claims, 4 Drawing Sheets

— — PRIOR ART— —

— — PRIOR ART— —

METHOD OF PLANARIZING POLYSILICON GATE

CROSS-REFERENCES TO RELATED APPLICATIONS

This application claims the priority benefit of Chinese patent application number 201610327876.6, filed on May 17, 2016, the entire contents of which are incorporated herein by reference.

FIELD OF THE INVENTION

The present invention relates to the field of semiconductor manufacturing, especially to a technology for forming a 28 nm technology node polysilicon gate, and more particularly to a method of planarizing a polysilicon gate.

BACKGROUND OF THE INVENTION

Referring to FIG. 1, there is a height difference between an active area and a shallow trench area before a polysilicon gate begins to grow. The height difference will make the surface of the polysilicon gate after growth uneven. The uneven polysilicon gate surface will cause a series of problems to the subsequent processes, particularly to integrated circuit products followed by a SiGe epitaxial growth, SiGe residue may be present above the protuberance of the polysilicon gate. Thus, the protuberances should be removed and the polysilicon gate surface should be flat.

The protuberances on the surface of the polysilicon gate can certainly be removed by chemical mechanical polishing, but a special slurry is needed to polish the polysilicon material and a thickness difference of the polysilicon gate will be increased remarkably, that is to say, although the some parts of the protuberance can be removed, the thickness uniformity of the polysilicon gate on the whole wafer will become poor.

Additionally, an oxide layer is formed on the surface of the silicon oxide layer; flat oxide film can be obtained by either the process of the flowably chemical vapor deposition (FCVD) or the process of the spin coating. Referring to FIG. 2, FIG. 2 is a view of the microscopic structure of the silicon oxide film deposited by FCVD, wherein the silicon oxide film is deposited faster on a trench area, thus the surface of the silicon oxide film obtained is flatter than the surface of the polysilicon gate layer.

Therefore, a technical solution for removing or eliminating the uneven surface of the polysilicon gate is expected to be provided, so as to further avoid a series of problems resulted from the uneven surface of the polysilicon gate in the subsequent processes.

BRIEF SUMMARY OF THE DISCLOSURE

Accordingly, at least one object of the present invention is to provide a method of planarizing a polysilicon gate, which can avoid a series of problems resulted from the uneven surface of the polysilicon gate in subsequent processes.

To achieve above object or another, the present invention provides a method of planarizing a polysilicon gate including:

step 01: growing a polysilicon gate layer on a substrate having trenches filled with materials; wherein the surface of the polysilicon gate layer is uneven;

step 02: depositing an oxide layer on the polysilicon gate layer; wherein the oxide layer has a flat surface;

step 03: oxidizing the top portion of the polysilicon gate layer from the flat surface of the oxide layer, thereby the top portion of the polysilicon gate layer is oxidized to form a silicon oxide interlayer; the bottom of the silicon oxide interlayer is aligned with or lower than the low-lying areas of the surface of the polysilicon gate layer;

step 04: removing the oxide layer and the silicon oxide interlayer formed by thermal oxidation, so as to form a flat surface of the polysilicon gate layer.

Preferably, in the method of planarizing a polysilicon gate, in the step 02, the oxide layer with a flat surface is formed by flowably chemical vapor deposition.

Preferably, in the method of planarizing a polysilicon gate, in the step 02, the oxide layer with a flat surface is formed by spin coating.

Preferably, in the method of planarizing a polysilicon gate, the material of the oxide layer is silicon oxide.

Preferably, in the method of planarizing a polysilicon gate, in the step 03, the polysilicon gate layer is oxidized by thermal oxidation.

Preferably, in the method of planarizing a polysilicon gate, the diffusion rate of the oxygen of the thermal oxidation in the oxide layer is as same as that in the polysilicon gate layer, thereby the height of the bottom of the silicon oxide interlayer obtained is uniform.

Preferably, in the method of planarizing a polysilicon gate, the polysilicon gate layer is grown on the substrate by flowably chemical vapor deposition.

Preferably, in the method of planarizing a polysilicon gate, the polysilicon gate layer is grown on the substrate by spin coating.

Preferably, in the method of planarizing a polysilicon gate, in step 04, the oxide layer and the silicon oxide interlayer formed by thermal oxidizing on the surface of the substrate are removed by wet cleaning.

Preferably, in the method of planarizing a polysilicon gate, the trenches filled with non-silicon material; wherein the non-silicon material is different from the material of the substrate.

Preferably, in the method of planarizing a polysilicon gate, the thickness of the polysilicon gate is in a range of 500 to 1000 Å.

Therefore, in the present invention, firstly the oxide layer is formed after the growth of the polysilicon gate in order to obtain a flat surface of the oxide layer due to the process character. That is to say, the low-lying areas of the surface of the polysilicon gate are filled with more oxide layer material. Then, performing an oxidization treatment to the substrate, in order to oxidize the polysilicon gate layer underlying the oxide layer and form a silicon oxide interlayer. Since the oxide layer on protuberances of the polysilicon gate layer is thinner than that on the low-lying areas of the polysilicon gate, the protuberances of the polysilicon gate layer are oxidized by the diffusion of the oxygen gas in the thermal oxidation earlier than the low-lying areas of the polysilicon gate layer and the height of the bottom of the silicon oxide interlayer is uniform and aligned with or lower than the low-lying areas of the surface of the polysilicon gate layer; then the oxide layer and silicon oxide interlayer is removed, so as to eliminate or remove the protuberances of the polysilicon gate layer and obtain a flatter surface of the polysilicon gate layer.

BRIEF DESCRIPTION OF THE DRAWINGS

The present invention will be understood fully and the advantages and characteristic thereof will be more comprehensively hereinafter with the accompanying drawings and with reference to the following description in further detail; wherein FIG. 1 illustrating a microscopic structure of the protuberances on the surface of the polysilicon gate according the conventional process FIG. 2 illustrating a microscopic structure of the silicon oxide film deposited by flowably chemical vapor deposition FCVD FIG. 3 illustrating a first step of the method of planarizing the polysilicon gate according to one embodiment of the present invention FIG. 4 illustrating a second step of the method of planarizing the polysilicon gate according to one embodiment of the present invention FIG. 5 illustrating a third step of the method of planarizing the polysilicon gate according to one embodiment of the present invention FIG. 6 illustrating a fourth step of the method of planarizing the polysilicon gate according to one embodiment of the present invention FIG. 7 illustrating a flow chart of the method of planarizing the polysilicon gate according to one embodiment of the present invention It is noted that, the accompanying drawings is used for explaining the present invention, not limiting the principle of the present invention. Note that, the structure in the accompanying drawings may not be drawn to scale. Furthermore, in the accompanying drawings, the same or similar elements are marked with the same or similar reference numerals.

DETAILED DESCRIPTION

The present invention will now be descried more comprehensively hereinafter with reference to the accompanying drawings, in which preferred embodiments of the invention are shown.

The present invention provides a method of planarizing the polysilicon gate, including: firstly, providing a wafer after the growth of the polysilicon gate; then, depositing an oxide layer with a certain thickness by floating chemical vapor deposition or spin coating; next, oxidizing the wafer, such as by thermal oxidization, in this process, the polysilicon gate is also oxidized to form the silicon oxide interlayer; finally, removing the oxide layer on the surface of the polysilicon gate surface and the silicon oxide interlayer, so as to eliminate or remove the protuberance of the polysilicon gate surface and obtain a flat polysilicon gate surface and avoid a series of problems resulted from the uneven surface in the subsequent processes.

Specifically, FIG. 3 to FIG. 6 are illustrating each step of the method of planarizing the polysilicon gate according to one embodiment of the present invention. FIG. 7 is illustrating a flow chart of the method of planarizing the polysilicon gate according to one embodiment of the present invention.

More specifically, referring to FIGS. 3 to 7, the method of planarizing the polysilicon gate according to one embodiment of the present invention includes:

step 01: growing a polysilicon gate layer 20 on a substrate 10 having trenches 11 filled with materials; wherein the surface of the polysilicon gate layer 20 is uneven;

specifically, the substrate 10 is a silicon substrate. The polysilicon gate layer 20 is grown on the substrate 10 by flowably chemical vapor deposition or by spin coating. Preferably, the thickness of the polysilicon gate layer 20 is in a range of 500 to 1000 Å. It is noted that, there may be one or more trenches in the substrate according to the present invention. One trench in the substrate will be exemplified in the embodiment, which will not limit the scope of the present invention.

Figure 1:
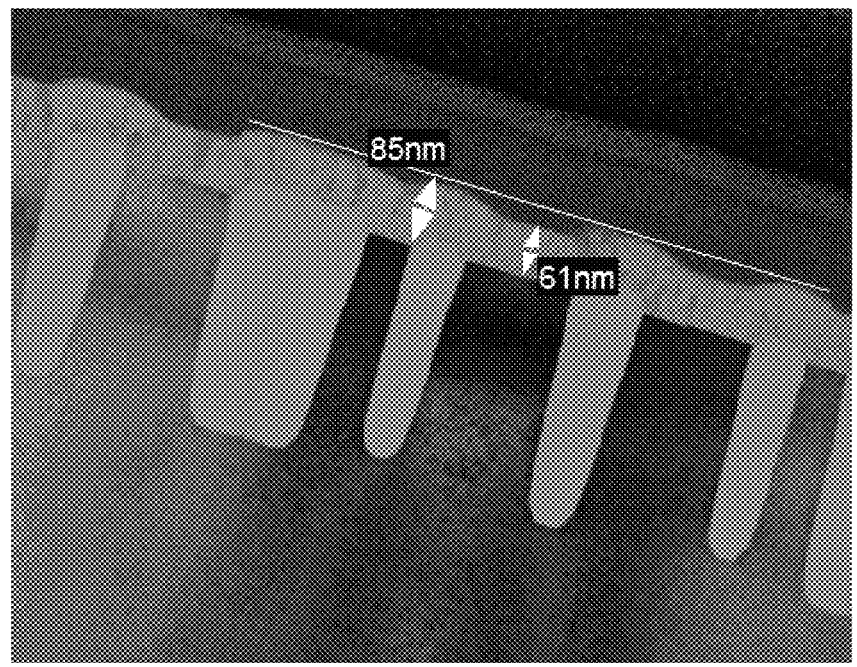
Figure 2:
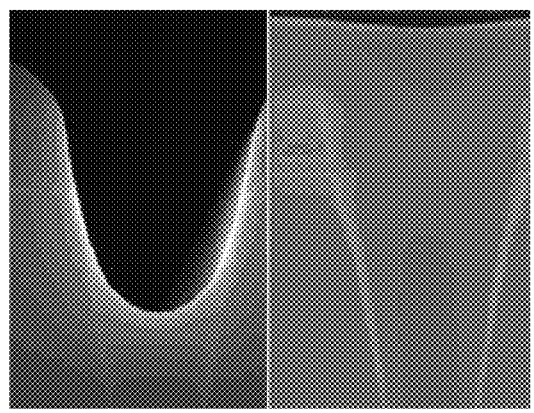
Figure 3:
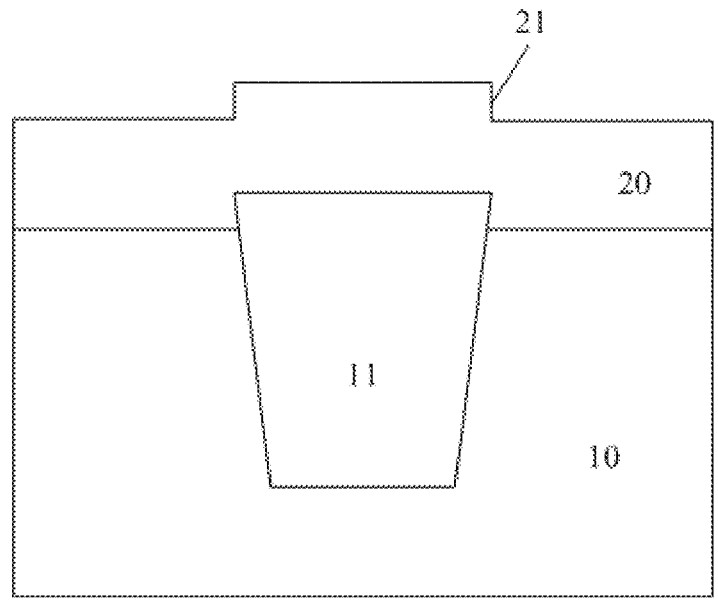
Figure 4:
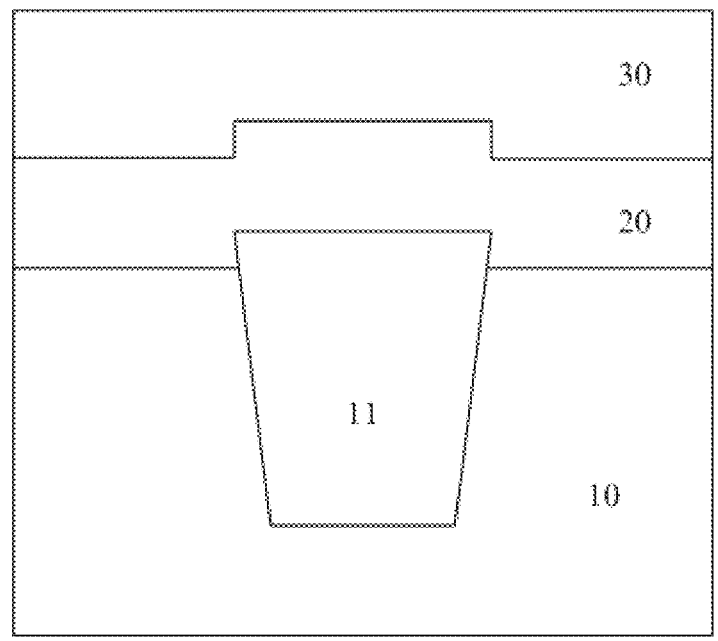

Referring to FIG. 3, herein a trench 11 filled with non-silicon material is formed in the substrate 10; wherein the non-silicon material is different from that of material of the silicon substrate. Since the non-silicon material filling in the trench 11 may protrude from the substrate 10, the surface of the polysilicon gate layer 20 corresponding to the trench 11 will has protuberances 21. Preferably, according to the thickness of the polysilicon gate layer 20 is in a range of 500 to 1000 Å, the height of the protuberance 21 is in a range of 100 to 300 Å, that is, the height from the top of the protuberance to the low-lying area is in a range of 100 to 300 Å. It is noted that, there may be one or more protuberances on the surface of the polysilicon gate layer according to the present invention. One protuberance on the surface of the polysilicon gate layer will be exemplified in the embodiment, which will not limit the scope of the present invention.

step 02: referring to FIG. 4, depositing an oxide layer 30 on the polysilicon gate layer 20; wherein the oxide layer has a flat surface;

specifically, the material of the oxide layer 30 is silicon oxide.

Figure 5:
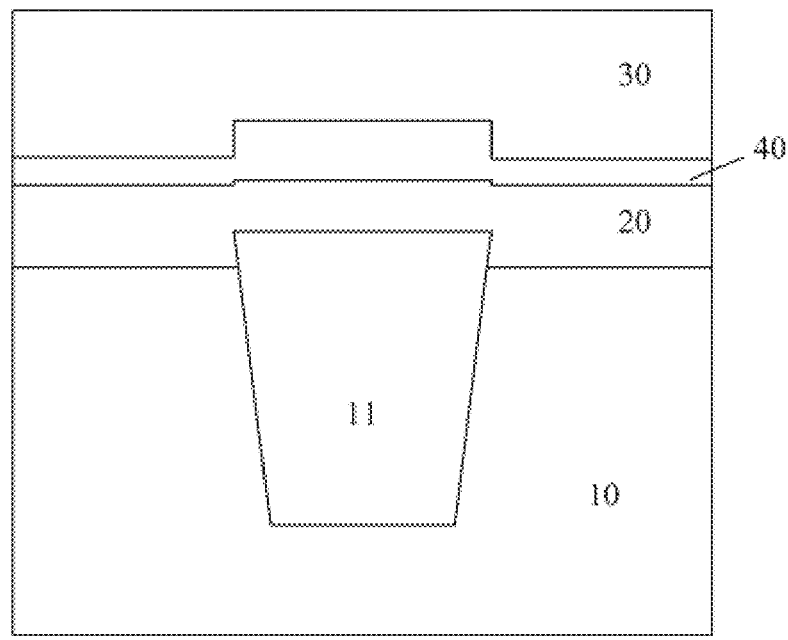

Preferably, in the step 02, the oxide layer 30 is grown on the polysilicon gate layer 20 by flowably chemical vapor deposition. Alternatively, the oxide layer 30 is grown on the polysilicon gate layer 20 by spin coating. The oxide layer 30 is formed by the flowably chemical vapor deposition or the spin coating has a very flat surface, as shown in FIG. 4.

step 03: oxidizing the top portion of the polysilicon gate layer 20 from the flat surface of the oxide layer 30, thereby the top portion of the polysilicon gate layer 20 is oxidized to form a silicon oxide interlayer 40; the bottom of the silicon oxide interlayer 40 is aligned with or lower than the low-lying areas of the surface of the polysilicon gate layer 20; referring to FIG. 5, the top portion of the polysilicon gate layer 20 is oxidized to form a silicon oxide interlayer 40.

Figure 6:
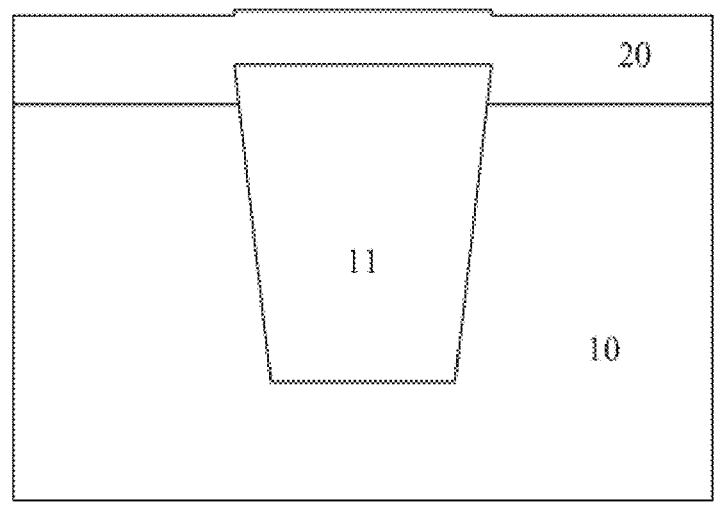
Figure 7:
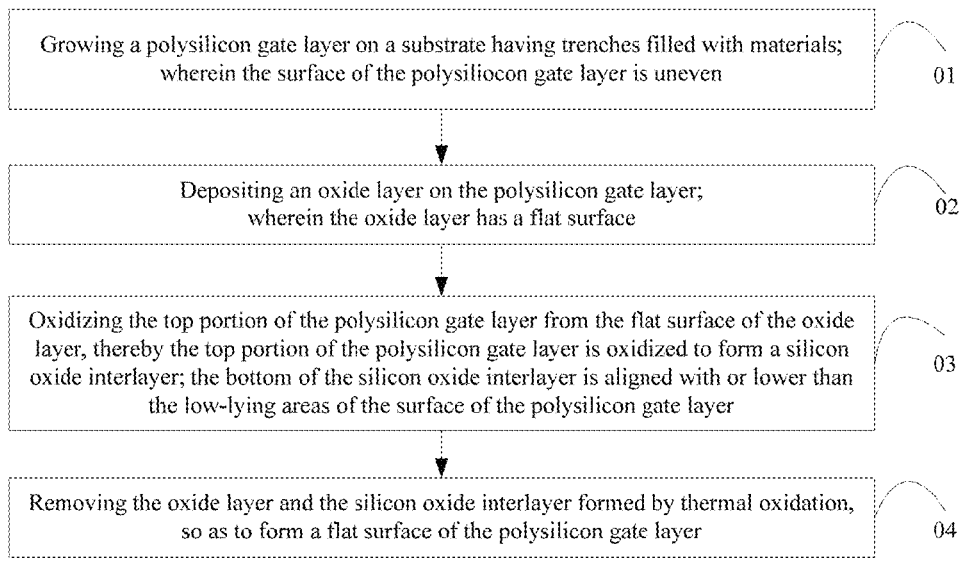

Since the oxide layer 30 on the protuberance 21 is thinner than the oxide layer 30 on the lowlying areas of the surface of the polysilicon gate layer 20, the protuberance 21 is oxidized earlier than the lowlying areas of the surface of the polysilicon gate layer 20 by the diffusion of the oxygen in the thermal oxidation. The diffusion rate of the oxygen diffusing in the oxide layer 30 is equal to or substantially as same as that in the polysilicon gate layer 20, thereby the height of the bottom of the silicon oxide interlayer 40 obtained is uniform.

step 04: referring to FIG. 6, removing the oxide layer 30 and the silicon oxide interlayer 50 formed by thermal oxidation, so as to form a flat surface of the polysilicon gate layer 20.

Specifically, in step 04, the oxide layer 30 and the silicon oxide interlayer 40 formed by thermal oxidation are removed by the process of wet cleaning. More specifically, in step 04, the oxide layer 30 and the silicon oxide interlayer 40 formed by thermal oxidion are removed by using a dilute hydrofluoric acid solution. The protuberance 21 of the polysilicon gate layer 20 are removed together with the silicon oxide interlayer 40, so as to obtain a flat surface of the polysilicon gate layer 20.

Referring to FIG. 6, after the step 04, only the thinning polysilicon gate layer 20 is remained on the surface of the substrate 10.

In the present invention, firstly the oxide layer is formed after the growth of the polysilicon gate, so as to obtain a flat surface of the oxide layer due to the process character. That is to say, the low-lying areas of the polysilicon gate layer are filled with more oxide layer material. Then, performing an oxidization treatment to the substrate, in order to oxidize the polysilicon gate layer underlying the oxide layer and form a silicon oxide interlayer. Since the oxide layer on protuberances of the polysilicon gate layer is thinner than that on the low-lying areas of the polysilicon gate, the protuberances of the polysilicon gate layer are oxidized by the diffusion of the oxygen gas in the thermal oxidation earlier than the low-lying areas of the polysilicon gate layer and the height of the bottom of the silicon oxide interlayer is uniform and aligned with or lower than the low-lying areas of the surface of the polysilicon gate layer; then the oxide layer and silicon oxide interlayer is removed, so as to eliminate or remove the protuberances of the polysilicon gate layer and obtain a flatter surface of the polysilicon gate layer.

Additionally, it is noted that, unless otherwise stated or indicated herein, the terms such as "first", "second", "third" are only used to distinguish the various components, elements, steps, etc., and not used to present the logical relationship or sequential relations of various components, elements, steps, etc.

It should be understood, the particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method of planarizing a polysilicon gate, comprising:
    step 01: growing a polysilicon gate layer on a substrate having trenches filled with materials; wherein the surface of the polysilicon gate layer is uneven;
    step 02: depositing an oxide layer on the polysilicon gate layer; wherein the oxide layer has a flat surface;
    step 03: oxidizing the top portion of the polysilicon gate layer from the flat surface of the oxide layer, thereby the top portion of the polysilicon gate layer is oxidized to form a silicon oxide interlayer; the bottom of the silicon oxide interlayer is aligned with or lower than the low-lying areas of the surface of the polysilicon gate layer;
    step 04: removing the oxide layer and the silicon oxide interlayer formed by thermal oxidation, so as to form a flat surface of the polysilicon gate layer.

2. The method of planarizing a polysilicon gate according to claim 1, wherein, in the step 02, the oxide layer with a flat surface is formed by flowably chemical vapor deposition.

3. The method of planarizing a polysilicon gate according to claim 1, wherein, in the step 02, the oxide layer with a flat surface is formed by spin coating.

4. The method of planarizing a polysilicon gate according to claim 2, wherein, the material of the oxide layer is silicon oxide.

5. The method of planarizing a polysilicon gate according to claim 1, wherein, in the step 03, the polysilicon gate layer is oxidized by thermal oxidation.

6. The method of planarizing a polysilicon gate according to claim 5, wherein, the diffusion rate of the oxygen from the thermal oxidation diffusing in the oxide layer is as same as that in the polysilicon gate layer, thereby the height of the bottom of the silicon oxide interlayer obtained is uniform.

7. The method of planarizing a polysilicon gate according to claim 1, wherein, the polysilicon gate layer is grown on the substrate by flowably chemical vapor deposition.

8. The method of planarizing a polysilicon gate according to claim 1, wherein, the polysilicon gate layer is grown on the substrate by spin coating.

9. The method of planarizing a polysilicon gate according to claim 1, wherein, in step 04, the oxide layer and the silicon oxide interlayer formed by thermal oxidizing are removed by wet cleaning.

10. The method of planarizing a polysilicon gate according to claim 1, wherein the trenches filled with non-silicon material; wherein the non-silicon material is different from the material of the substrate.

11. The method of planarizing a polysilicon gate according to claim 1, wherein the thickness of the polysilicon gate is in a range of 500 to 1000 Å.

12. The method of planarizing a polysilicon gate according to claim 3, wherein, the material of the oxide layer is silicon oxide.

* * * * *